United States Patent
Spady et al.

(10) Patent No.: US 6,854,948 B1
(45) Date of Patent: Feb. 15, 2005

(54) STAGE WITH TWO SUBSTRATE BUFFER STATION

(75) Inventors: Blaine R. Spady, Lincoln, NE (US); Dan M. Colban, Tracy, CA (US); Robert S. Kearns, Saratoga, CA (US)

(73) Assignee: Nanometrics Incorporated, Milpitas, CA (US)

(*) Notice: Subject to any disclaimer, the term of this patent is extended or adjusted under 35 U.S.C. 154(b) by 118 days.

(21) Appl. No.: 10/219,569

(22) Filed: Aug. 15, 2002

(51) Int. Cl.[7] .............................................. B65G 49/07
(52) U.S. Cl. ................. 414/416.03; 414/281; 414/938; 414/936
(58) Field of Search ........................... 414/935–937, 414/416.03, 267, 281

(56) References Cited

U.S. PATENT DOCUMENTS

| | | | |
|---|---|---|---|
| 3,976,330 A | 8/1976 | Babinski et al. | ............ 302/2 R |
| 4,178,113 A | 12/1979 | Beaver, II et al. | ............ 406/10 |
| 5,024,570 A | 6/1991 | Kiriseko et al. | ............ 414/222 |
| 5,275,521 A * | 1/1994 | Wada | ............ 414/404 |
| 5,697,748 A * | 12/1997 | Somekh et al. | ............ 414/217 |
| 5,931,627 A * | 8/1999 | Okada et al. | ............ 414/416.08 |
| 6,042,623 A | 3/2000 | Edwards | ............ 29/25.01 |
| 6,212,961 B1 | 4/2001 | Driv | ............ 73/865.8 |
| 6,244,931 B1 | 6/2001 | Pinson et al. | ............ 451/8 |
| 6,309,163 B1 * | 10/2001 | Nering | ............ 414/331.01 |
| 6,368,181 B1 | 4/2002 | Dvir et al. | ............ 451/6 |
| 6,390,767 B1 | 5/2002 | Alper et al. | ............ 414/936 |
| 6,438,449 B2 | 8/2002 | Kawamatsu et al. | ........ 700/229 |
| 2001/0001888 A1 | 5/2001 | Haimovich et al. | ........ 29/25.01 |
| 2001/0025533 A1 | 10/2001 | Dvir | ............ 73/865.8 |
| 2002/0048506 A1 | 4/2002 | Babbs et al. | ............ 414/783 |

FOREIGN PATENT DOCUMENTS

| | | | |
|---|---|---|---|
| EP | 1 060 836 A2 | 12/2000 | |
| JP | 2-192752 | 7/1990 | ........... H01L/21/68 |
| JP | 3-145150 | 6/1991 | ........... H01L/21/68 |
| JP | 4-209110 | 7/1992 | ........... B65G/1/07 |
| JP | 2000-208592 | 7/2000 | ........... H01L/21/68 |

\* cited by examiner

*Primary Examiner*—Eileen D. Lillis
*Assistant Examiner*—Mark A. Deuble
(74) *Attorney, Agent, or Firm*—Silicon Valley Patent Group LLP (57) ABSTRACT

A stage used, e.g., in semiconductor fabrication, includes a two substrate buffer station and a movable chuck. The buffer station, in one embodiment is fixed, i.e., non-movable relative to the stage. In another embodiment, the support elements of the buffer station may move in unison vertically or horizontally. In another embodiment, a pair of the support elements horizontally moves toward another pair of support elements to reduce the necessary horizontal motion of the chuck. For example, an unprocessed substrate is loaded onto the top supporting elements of the buffer station, while processed substrates are unloaded from the bottom supporting element of the buffer station. The movable chuck is used to remove the unprocessed substrates from the buffer station and to place the processed substrates on the buffer station.

12 Claims, 7 Drawing Sheets

Fig. 1
(Conventional)

STAGE WITH TWO SUBSTRATE BUFFER STATION

FIELD OF THE INVENTION

The present invention relates to substrate handling and positioning and in particular to a buffering apparatus and method.

BACKGROUND

In semiconductor fabrication it is necessary to transport substrates from one station to another. For example, it is necessary to move substrates from a cassette station to a processing station and/or metrology tool. Typically, substrates are transported using a robotic arm.

Figure 1:
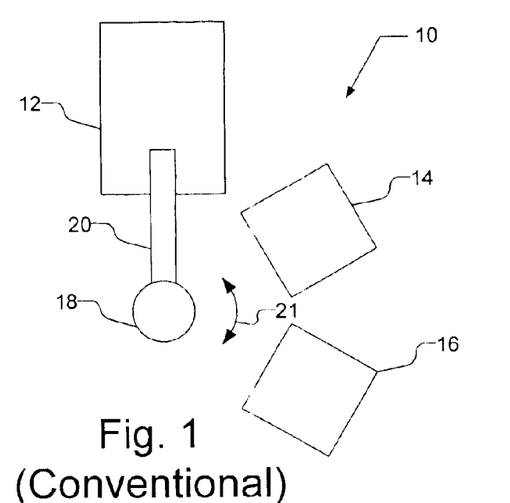
FIG. 1 shows a conventional substrate processing environment having a stage, a load cassette station, an unload cassette station, and a robot transfer device.

FIG. 1 shows a conventional substrate processing environment 10. Processing environment 10 includes a stage 12, a load cassette station 14, an unload cassette station 16 and a robot transfer device 18. It should be understood that the stage 12 may alternatively be used with a metrology unit, a processing unit or a combination processing/metrology unit. As shown in FIG. 1, the robot transfer device 18 has a single arm 20 that is used to transport a substrate (not shown) from the load cassette station 14 to the stage 12 and from the stage 12 to the unload cassette station 16.

A disadvantage with conventional stage 12 is that it has a single substrate support and thus has a single substrate capacity. As a result, the robot transfer device 18 must first unload a processed substrate from the stage 12 and place the processed substrate in the unload cassette station 16 before the robot transfer device 18 can remove an unprocessed substrate from the load cassette station 14 and load the unprocessed substrate onto the stage 12. Thus, stage 12 is idle while the robot transfer device 18 unloads the processed substrate and loads the unprocessed substrate. The movements of the robot transfer device 18 take time and thus increase the idle time of the stage 12 and increase the amount of time required for substrate handling. As a result, the throughput, i.e., the number of substrates processed per unit of time, is lower than desirable.

Therefore, there is a need for a stage having an inexpensive and relatively simple buffering station for supporting one or more substrates to increase the throughput of the system.

SUMMARY

A stage used, e.g., in semiconductor fabrication, includes a fixed, i.e., non-movable, buffer station and a movable chuck in one embodiment of the present invention. The fixed buffer station can hold two substrates. For example, an unprocessed substrate is loaded onto the top supporting elements of the buffer station, e.g., by a single arm robot transfer device, while processed substrates are unloaded from the bottom supporting element of the buffer station. The movable chuck is used to remove the unprocessed substrates from the buffer station and to place the processed substrates on the buffer station. Because the buffer station is fixed, i.e., does not move, the cost and complexity of the device is less than conventional movable buffer stations.

In one embodiment of the present invention, a stage includes a base, a chuck movably coupled to the base, such that the chuck is movable in at least a horizontal direction. The stage includes a buffer station that has a plurality of support elements including a first and second set of support elements, the first set of support elements hold a substrate higher than the second set of support elements. The support elements have a fixed position relative to each other. The substrates are loaded onto and off of the chuck by vertical movement of either the chuck of the buffing station. In one embodiment, the chuck is movable in a vertical direction and in another embodiment, the support elements are movable relative to the base, e.g., vertically or horizontally in a direction parallel to the horizontal direction of travel of the chuck.

The support elements are separated from each other so that they can support a substrate at the periphery and not interfere with the vertical or horizontal direction of travel of the chuck.

In another embodiment, there is at least one element in both the first and second support elements that move horizontally with respect to the base in a direction parallel to the horizontal direction of travel of the chuck. The remaining support elements may have a fixed position relative to the base.

In another embodiment, a stage includes a base and a chuck that moves in a horizontal linear direction relative to the stage. The stage includes a buffer station that includes a first set of support elements and a second set of support elements that have a fixed position relative to each other. The support elements are separated from each other so that they can support a substrate at the periphery of the substrate while allowing the chuck to pass between the support elements without contacting the support elements. The first set of support elements support a substrate in a position higher than the position that said second set of support elements support a substrate. The chuck or the buffer station may move in a vertical direction to load and unload substrates onto the chuck.

In another embodiment of the present invention, a method of buffering substrates that are being loaded and unloaded to and from a stage includes loading a first substrate onto a top support element of a fixed buffering station. The method includes raising a chuck in a vertical direction to lift the first substrate off the top support element and moving the chuck in a horizontal direction to remove the first substrate from the fixed buffering station. The chuck is then lowered with the substrate. A second substrate is loaded onto the top support element of the fixed buffering station. The chuck is raised in a vertical direction to lift the first substrate higher than the bottom support element of the fixed buffering station and the chuck is moved in a horizontal direction to place the first substrate over the bottom support element of the fixed buffering station. The chuck is then lowered to place the first substrate on the bottom support element of the fixed buffering station. The first substrate is then unloaded from the bottom support element of the fixed buffering station. If desired, the first and second substrates may be loaded onto the buffering station by a single arm robot transfer device. The second substrate can be loaded onto the top support element after moving the chuck in a horizontal direction to remove the first substrate and before unloading the first substrate from the bottom support element.

DETAILED DESCRIPTION

Figure 2:
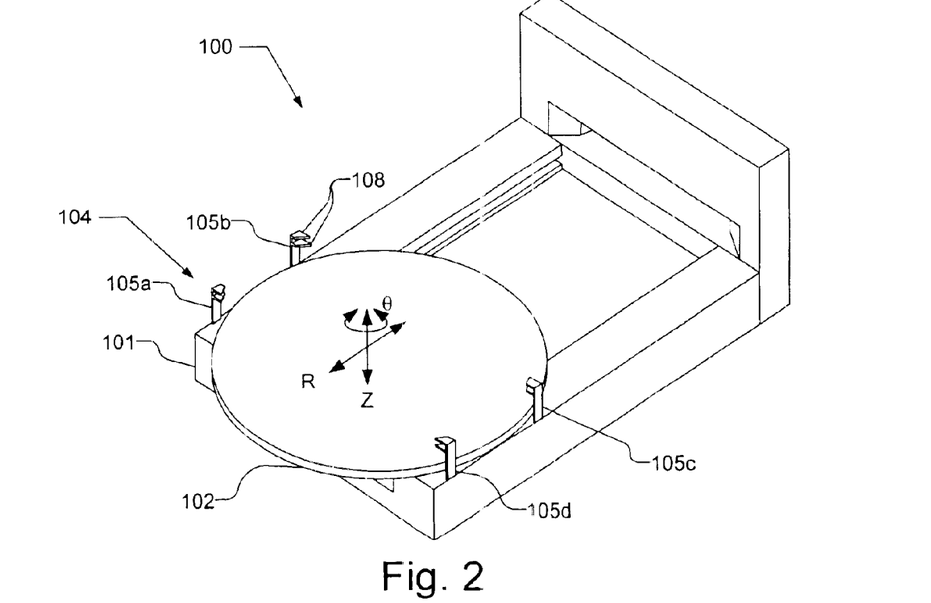
FIG. 2 is a perspective view of a stage with a fixed buffer station in accordance with an embodiment of the present invention.

FIG. 2 is a perspective view of a stage 100 with a two substrate buffer station in accordance with an embodiment of the present invention. Stage 100 may be used with or as part of a metrology device or a processing stage. As shown in FIG. 2, stage 100 includes a base 101, a movable chuck 102 and the buffer station, generally referred to herein as buffer station 104. Chuck 102 is capable of horizontal linear motion, angular rotation, and vertical linear motion (shown in FIG. 2 as arrows labeled R, θ, and Z, respectively), relative to the base 101 and the buffers 104. Alternatively, if desired, chuck 102 may be capable of horizontal linear motion in two orthogonal directions and vertical linear motion, i.e., X, Y, and Z directions, however, the space required for such a device is substantially greater than what is required for R, θ, Z motion.

The buffer station 104 is fixed, i.e., not movable, relative to the stage 100, in accordance with an embodiment of the present invention. In one embodiment, buffer station 104 includes a number of vertical supporting beams 105a, 105b, 105c, and 105d (sometimes collectively referred to herein as supporting beams 105) that are connected to the base 101 of the stage 100. Connected to each supporting beam 105 are two horizontal support elements, a top support element 108a and a bottom support element 108b (sometimes collectively referred to herein as horizontal support elements 108). The horizontal support elements 108 are positioned such that they are separated to support a substrate at the periphery, while allowing the chuck to raise between the horizontal support elements 108 without contacting horizontal support elements 108.

It should be understood that while four vertical supporting beams 105 are shown in FIG. 2 connected to the base 101, any number of supporting beams and any configuration may be used to hold the horizontal support elements in a fixed position. For example, the vertical support beam pairs 105a, 105b and 105c, 105d may each be replaced with a single vertical support beam. Moreover, vertical support beams 105 need not be directly connected to the stage 100.

Figure 3:
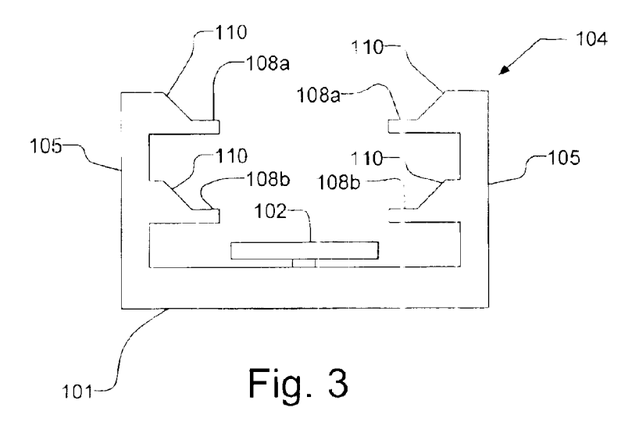
FIG. 3 is a front view of the stage with the fixed buffer station.
Figure 4:
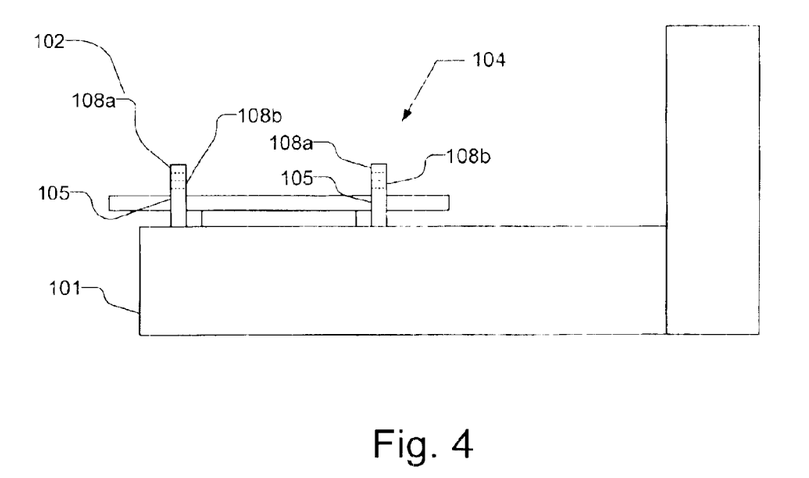
FIG. 4 is a side view of the stage with the fixed buffer station.

FIGS. 3 and 4 are front and side views of stage 100 showing supporting beams 105 and the horizontal support elements 108. As shown in FIG. 3, the top surface of the horizontal support elements 108 may include an inclined portion 110, which is useful in aligning a substrate when the substrate is loaded onto the support elements 108. It should be understood that FIG. 3 is out of scale relative to FIGS. 2 and 4 to illustrate the inclined portions 110.

In operation, the horizontal and vertical linear motion of chuck 102 is used to remove and replace substrates from the buffer station 104. The R, θ, Z motion for chuck 102 on stage 100 is conventionally used in existing stages well known to those of ordinary skill in the art. For example, an R, θ, Z stage may be used with the present invention such as that described in U.S. Pat. No. 6,320,609, issued Nov. 20, 2001, which is incorporated herein by reference. Because the stage 100 uses the vertical and horizontal motion of the chuck to load and unload substrates from the buffer station 104, buffer station 104 requires no moving parts. Consequently, stage 100 with the fixed buffer station 104 is less costly and less complex than conventional stages using moving buffering stations. Moreover, because buffer station 104 has no moving parts, buffer station 104 does not increase the risk of particle generation and contamination of the substrates.

Buffer station 104 may be used to advantageously increase throughput of a system that uses a single arm robot transfer device, e.g., robot transfer device 18 illustrated in FIG. 1. Thus, for example, robot transfer device 18 may load an unprocessed substrate (i.e., a substrate to undergo measurement or processing at the stage) onto the buffer station 104 prior to removing a processed substrate (i.e., a substrate that has completed measurement or processing at the stage) from the buffer station 104. Because robot transfer device 18 does not have to unload the processed substrate prior to loading an unprocessed substrate, the idle time for the stage 100 is much reduced compared to the conventional stage 12 described in FIG. 1. Consequently, buffer station 104 advantageously increases throughput.

Figure 5:
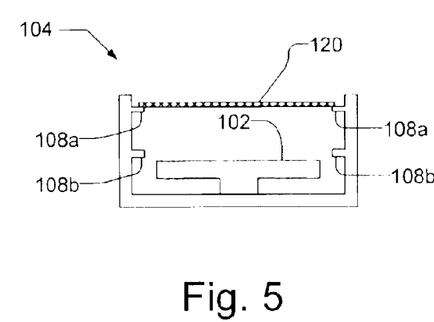
FIGS. 5 through 14 are front and top views of the stage with the fixed buffer station, illustrating the operation of the present invention.
Figure 6:
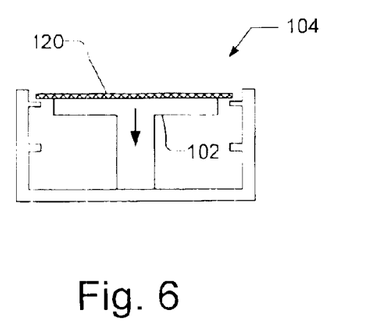
Figures 7, 8:
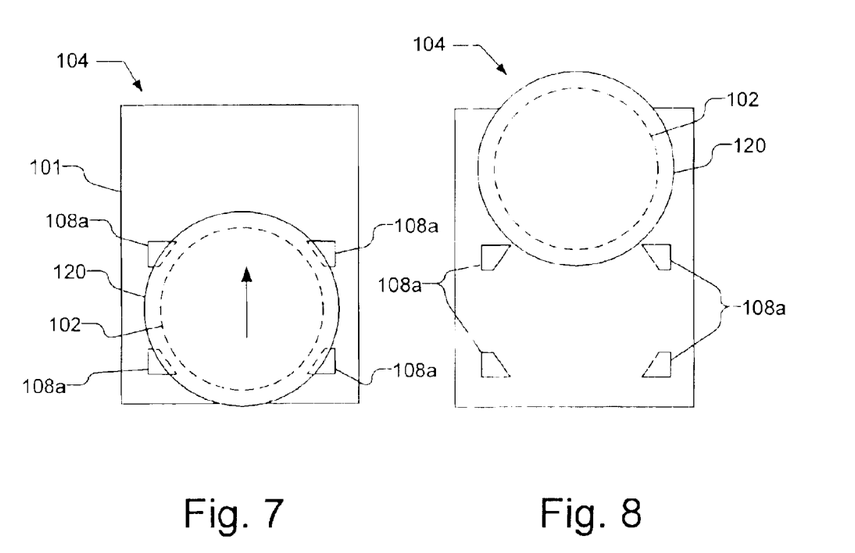
Figures 9, 11:
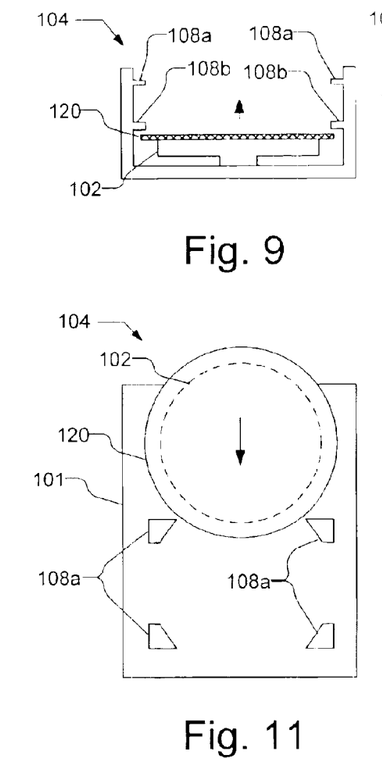

The operation of stage 100 with buffer station 104 is described in more detail with respect to FIGS. 5–14, which show front and top views of stage 100. FIG. 5 shows stage 100 with an unprocessed substrate 120 loaded on the top support elements 108a of buffer station 104. Substrate 120 was loaded on top support elements 108a, e.g., by robot transfer device 18 shown in FIG. 1. The chuck 102 is raised in the vertical direction until substrate 120 is lifted off the support elements 108a, as shown in FIG. 6. The chuck 102 is moved in a horizontal linear direction, as illustrated by the arrow in FIG. 7, until the substrate 120 is removed from the buffer station 104 as shown in FIG. 8. The chuck 102 is then lowered in the vertical direction, as illustrated by the arrow in FIG. 6. The substrate 120 is no longer in buffer station 104, and thus is in position to be processed, e.g., measured by a desired metrology tool or otherwise processed at stage 101, as illustrated in FIG. 9.

Figure 10:
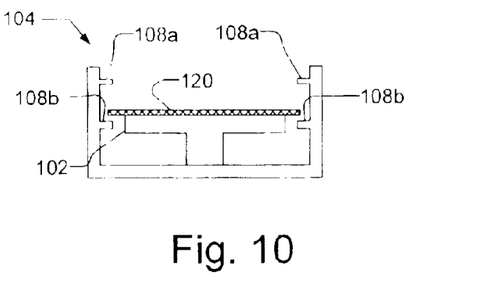
Figure 12:
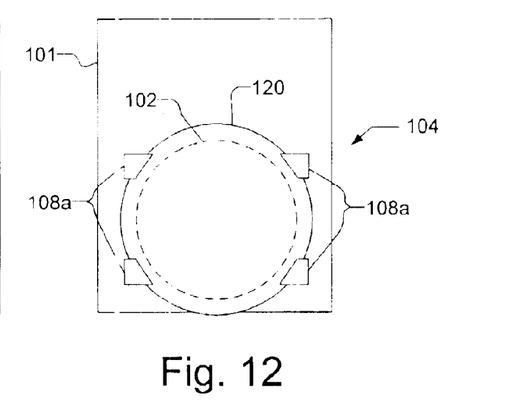
Figure 13:
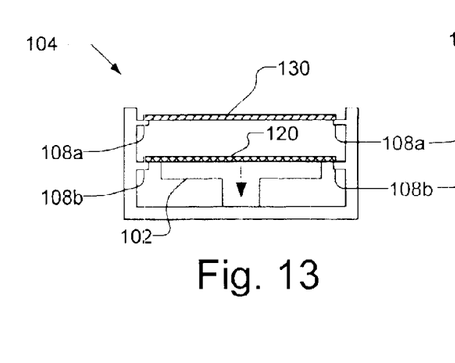

Once the processing of substrate 120 is complete, processed substrate 120 is unloaded from the stage 100 and back onto the buffer station 104 by raising chuck 102 in the vertical direction (indicated by the arrow in FIG. 9) until the substrate 120 is slightly higher than the bottom support elements 108b, but below the top support elements 108a, as shown in FIG. 10. The chuck 102 is then moved in the horizontal linear direction (indicated by the arrow in FIG. 11) until the processed substrate 120 is positioned within the buffer station 104 as shown in FIG. 12. The chuck 102 is then lowered to place the substrate 120 on the bottom support elements 108b, as shown in FIG. 13.

Figure 14:
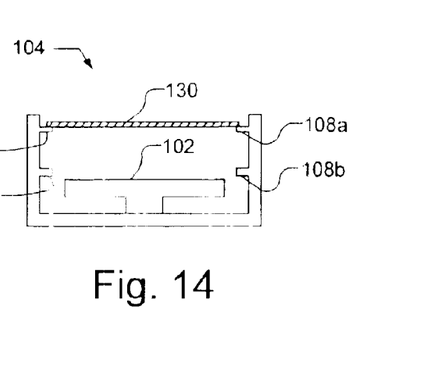

The robot transfer device 18 loads a new (unprocessed) substrate 130 on the top support elements 108a of buffer station 104. The new substrate 130 may be loaded at anytime after removing substrate 120 from the top supports elements 108a and prior to removing substrate 120 from the bottom support elements 108b (as indicated in FIG. 13). For example, substrate 130 may be loaded while substrate 120 is being processed, while substrate 120 is being placed on the bottom support elements 108b, or after substrate 120 is placed on the bottom support elements 108b. The robot transfer device 18 then removes the processed substrate 120 from the bottom support elements 108b leaving only the new substrate 130 on the top support elements 108a, as shown in FIG. 14. The new substrate 130 may then be loaded onto stage 100, i.e., removed from buffer station 104, and processed in the same manner as described above for substrate 120.

In accordance with another embodiment of the present invention, the buffer station includes horizontal support elements that do not have fixed positions relative to the stage, but that have fixed positions relative to each other. For example, the horizontal support elements may move together in a vertical linear direction. The vertical linear motion of the horizontal support elements is particularly useful when a device, such as a lens, would interfere with loading a substrate onto the top support element if the support elements could not be moved.

FIGS. 15–19 show the operation of a buffer station 204 that has vertical linear motion in accordance with the present invention. FIGS. 15–19 show the front view of a stage 200 with a movable chuck 202 along with the buffer station 204. Buffer station 204 is similar to buffer station 104 shown in FIGS. 2–14, like designated elements being the same, however, buffer station 204 is movable in the vertical direction.

Figures 15, 16:
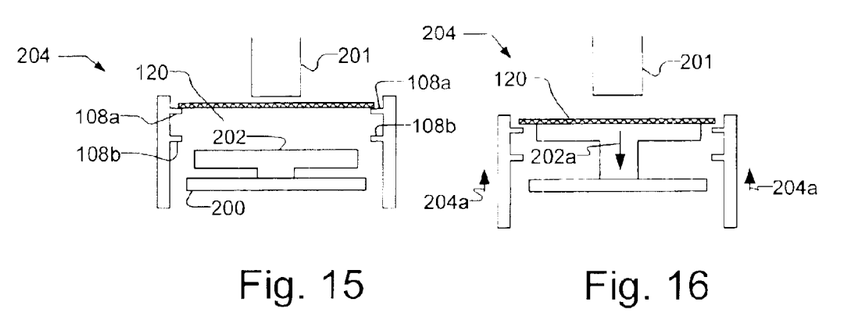
FIGS. 15 through 19 are front and top views of a buffer station that has support elements that are fixed relative to each other and that are movable vertically.

As shown in FIG. 15, an unprocessed substrate 120 is loaded on the top support elements 108a of buffer station 204. Buffer station 204 is in a lowered position while the substrate 120 is loaded on the top support elements 108a. The ability to lower buffer station 204 is useful, e.g., when an object such as lens 201 would interfere with substrate 120 if buffer station 204 could not be lowered. The chuck 202 is raised in the vertical direction and the buffer station 204 is lowered until substrate 120 is lifted off the support elements 108a, as shown in FIG. 16. The chuck 202 is then moved in a horizontal linear direction similar to that shown in FIG. 7, until the substrate 120 is removed from the buffer station 204. Once the substrate 120 is removed from the buffer station 204, the chuck 202 is lowered, as indicated by arrow 202a, and the buffer station 204 is raised, as indicated by arrows 204a in FIG. 16. The substrate 120 is no longer in buffer station 204, and thus can be processed.

Figure 17:
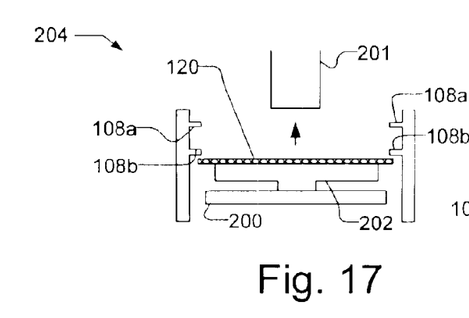
Figure 18:
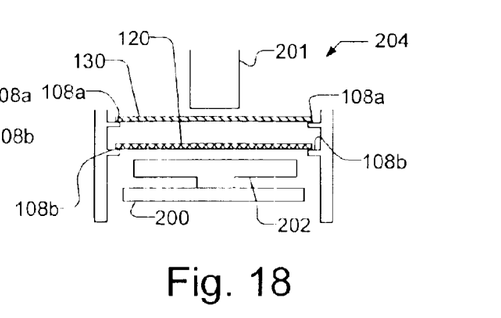
Figure 19:
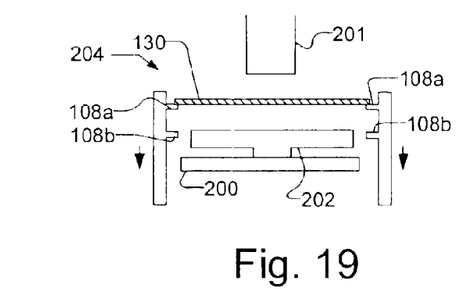

To unload substrate 120, chuck 202 is raised vertically, as shown in FIG. 17 and moved in a horizontal direction, similar to that shown in FIG. 11, and chuck 202 is then lowered, leaving substrate 120 on the bottom support elements 108b as shown in FIG. 18. A robot transfer device 18, shown in FIG. 1, can then load a new substrate 130 on the top support elements 108a, as illustrate din FIG. 18. The robot transfer device 18 can then unload substrate 120 from the bottom support elements 108b as illustrated in FIG. 19. The processing of new substrate 130 continues in the same manner as described above.

Figures 20, 21:
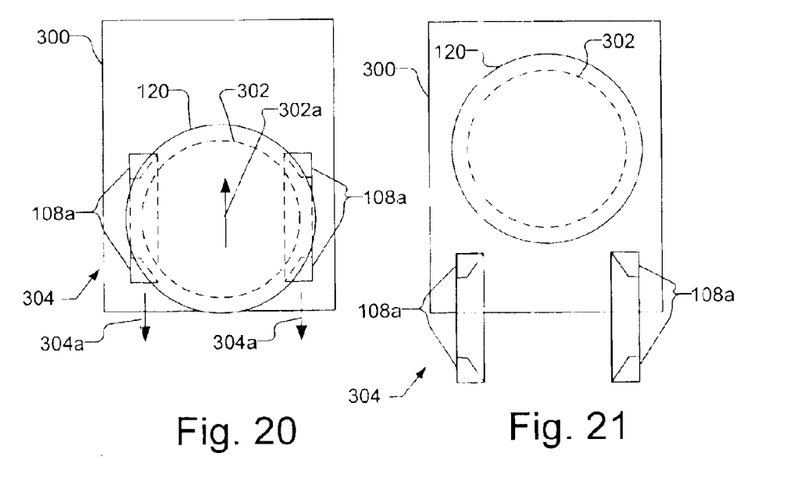
FIGS. 20 and 21 are top views of a buffer station that has support elements that are fixed relative to each other and that are movable horizontally.

FIGS. 20 and 21 show another embodiment of a buffer station 304 in which the horizontal support elements are movable relative to the stage in accordance with the present invention, but have fixed positions relative to each other. Buffer station 304 is similar to buffer station 104 shown in FIGS. 2–14, like designated elements being the same, however, buffer station 304 is capable of linear horizontal motion. FIGS. 20 and 21 are similar, e.g., to FIGS. 7 and 8 and show top views of buffer station 304 along with stage 300 and chuck 302 holding a substrate 120. As illustrated in FIGS. 20 and 21, horizontal elements 108a of buffer station 304 are coupled together and are moved together in unison relative to stage 300, e.g., by way of an actuator. Thus, the chuck 302 moves in a horizontal direction, indicated by arrow 302a, while the supporting elements 108 of buffer station 304 move horizontally in unison in the opposite direction, indicate by arrows 304a. Because supporting elements 108 of buffer station 304 move horizontally, the horizontal movement necessary for chuck 302 to remove substrate from buffer station 204 is minimized. Thus, the present embodiment is particularly useful when the horizontal movement of chuck 302 is restricted. In one embodiment, the substrate is loaded from and onto the buffer station 304 while the buffer station 304 is displaced horizontally, as shown in FIG. 21.

Figure 22:
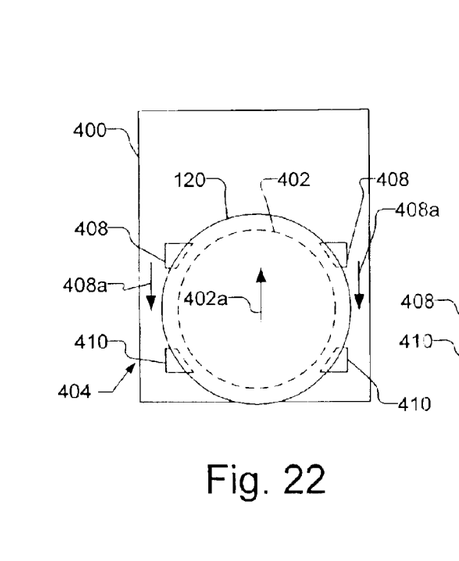
FIGS. 22 and 23 are top views of a buffer station that has support elements, a portion of which are movable horizontally.
Figure 23:
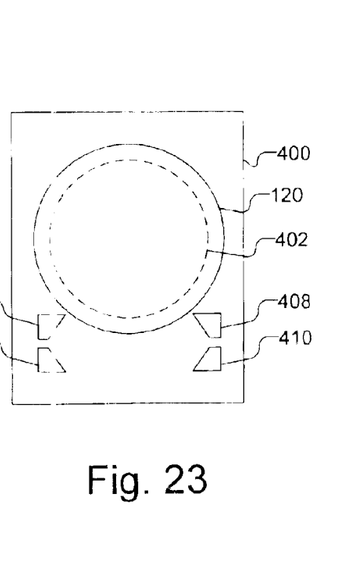
Figure 24:
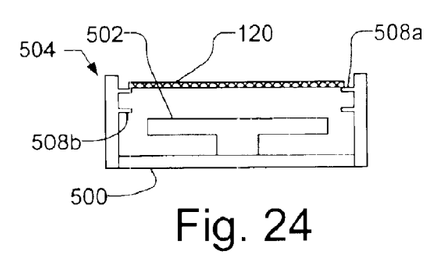
FIGS. 24 through 28 show another embodiment of a buffer station, in which the horizontal support elements are movable vertically relative to the stage, but have a fixed position relative to each other.

FIGS. 22 and 23 show another embodiment of a buffer station 404 in which a portion of the horizontal support elements are movable relative to the stage in accordance with the present invention. FIGS. 22 and 24 are similar to FIGS. 20 and 21. However, buffer station 404 moves only two of the supporting elements 408 in unison in a horizontal direction opposite the direction of travel of the chuck, as indicated by arrows 408a, while holding supporting elements 410 fixed. Because supporting elements 408 of buffer station 404 move horizontally, the amount of horizontal movement of chuck 402, illustrated by arrow 402a in FIG. 22, is minimized. Unlike U.S. Pat. No. 6,212,961, the horizontal support elements 408 and 410 of buffer station 404 do not separate so as to not disturb the motion of the chuck 402, but rather support elements 408 move in unison in a horizontal direction opposite that of the chuck and thus support elements 408 move toward support elements 410.

FIGS. 24 to 28 show yet another embodiment of a buffer station 404, in which the horizontal support elements are movable vertically relative to the stage, but have a fixed position relative to each other. Buffer station 504 is similar to buffer station 104 shown in FIGS. 2–14, like designated elements being the same, however, buffer station 504 is capable of linear vertical motion. The horizontal support elements 508a and 508b of buffer station 504 are moved together vertically in unison relative to stage 500, e.g., by way of an actuator. The buffer station 504 has three positions relative to stage 500: a top position, a bottom position and a mid position.

Figure 25:
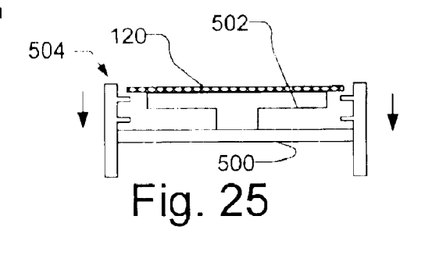

In operation, a substrate 120 is loaded into the top support 508a on buffer station 504 while buffer station 504 is in the top position, as shown in FIG. 24. As illustrated in FIG. 25, the buffer station 504 then moves downward relative to stage 500 (indicated by the arrows in FIG. 25) until the substrate 120 is loaded on the chuck 502, which is the bottom position for the buffer station 504. The chuck 502 then moves horizontally to place the substrate 120 in position for processing. After processing, the chuck 502 moves back and the buffer station 504 moves upward relative to the stage 500 (as indicated by the arrows in FIG. 26) to place the processed substrate 120 back in the top support 508a of buffer station 504 and to place the buffer station 504 back in the top position.

Figure 26:
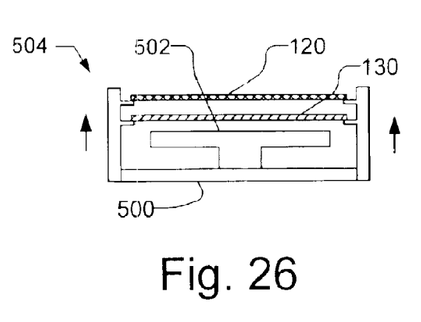
Figure 27:
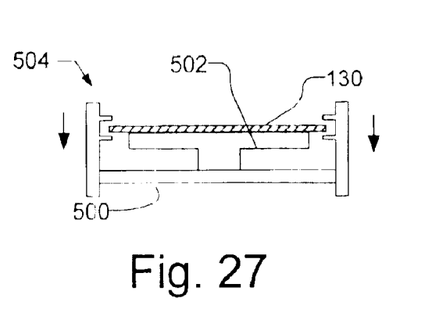
Figure 28:
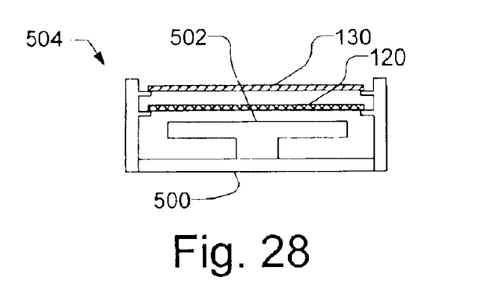

A robot arm, e.g., robot arm 20 shown in FIG. 1, can then load a new substrate 130 on the bottom support 508b of the buffer station 504. Thus, the processed substrate 120 is on the top support 508a and the new unprocessed substrate 130 is on the bottom support 508b of the buffer station 154, as shown in FIG. 26. The robot arm 20 can then remove the processed substrate 120 and the buffer station 504 moves downward relative to the stage 500 (as indicated by the arrows in FIG. 27) to the mid position to load the new substrate 130 on the chuck 502, as shown in FIG. 27. The chuck 502 moves horizontally to place the substrate 130 in position for processing. During processing of substrate 130, the buffer station 504 moves downward to the bottom position (similar to that shown in FIG. 25, except substrate 130 is on chuck 502). After processing the substrate 130, the chuck 502 moves back and the buffer station 504 moves upward relative to the stage 500 to place the processed substrate 130 back in the top support 508a of buffer station 504. The process of loading and unloading can then repeated.

It should be understood, that if desired, the initial substrate 120 may be loaded onto the bottom support 508b of buffer station 504. The process then continues as described, with processed substrates being placed on the top support 508a of the buffer station 504 and new substrates being placed on the bottom support 508b of the buffer station 504.

In another embodiment, the chuck 504 places the processed substrate 120 on the bottom support 508b of buffer station 504 and the new substrate 130 is loaded onto the top support 508a of the buffer station 504. The robot arm 20 can then remove the processed substrate 120 from the bottom support 508b and the new substrate 130 is loaded onto the chuck 502 by lowing the buffer station 504 to the bottom position (similar to that shown in FIG. 25, except substrate 130 is on chuck 502). Thus, processed substrates are placed on the bottom support 508b of the buffer station 504 and new substrates are placed on the top support 508a of the buffer station 504.

These embodiments are particularly useful in minimizing robot time, as the robot need come to the buffer station only once to both load a new substrate and unload a processed substrate. Of course, if desired, a dual arm robot transfer device may be used with the present inventions.

Although the invention has been described with reference to particular embodiments, the description is only an example of the invention's application and should not be taken as a limitation. In particular, even though much of the preceding was aimed at a buffering station in a metrology stage, it should be understood that the buffering station may be used with any desired stage. Various other adaptations and combinations of features of the embodiments disclosed are within the scope of the invention as defined by the following claims.

What is claimed is:

1. A wafer measuring stage comprising:
   a base;
   a chuck movably coupled to said base, said chuck movable in at least a horizontal linear direction with respect to said base; and
   a fixed buffer station having a plurality of support elements fixedly positioned above said base, said plurality of support elements including a first set of support elements for holding a substrate and a second set of support elements for holding a substrate, wherein said first set of support elements hold a substrate above a substrate held by the second set of substrates, said plurality of support elements having fixed horizontal and vertical positions relative to each other.

2. The stage of claim 1, wherein said first set of support elements comprises four support elements and said second set of support elements comprises four support elements.

3. The stage of claim 1, wherein said first set of support elements have a top surface for supporting a substrate, said top surface having an inclined portion for aligning a substrate on the top surface of said first set of support elements; and wherein said second set of support elements have a top surface for supporting a substrate, said top surface having an inclined portion for aligning a substrate on the top surface of said second set of support elements.

4. The stage of claim 1, wherein said chuck is rotatable.

5. The stage of claim 1, wherein said chuck is movable in two horizontal directions that are orthogonal to each other.

6. The stage of claim 1, wherein said chuck is movable in a vertical direction and wherein said chuck loads and unloads substrates onto said plurality of support elements.

7. The stage of claim 6, wherein said chuck unloads substrates from said first set of support elements and loads substrates onto said second set of substrates.

8. The stage of claim 6, wherein said chuck is movable in a vertical linear direction between at least two of said first set of support elements and between at least two of said second set of support elements.

9. The stage of claim 6, wherein:
   the support elements in said first set of support elements are separated from each other so that they can support a substrate at the periphery of the substrate while allowing the chuck to raise between the first set of support elements without contacting said first set of support elements; and
   the support elements in said second set of support elements are separated from each other so that they can support a substrate at the periphery of the substrate while allowing the chuck to rise between the second set of support elements without contacting said second set of support elements.

10. The stage of claim 6, wherein said plurality of support elements having a fixed position relative to said base.

11. A wafer measuring stage comprising:
   a base;
   a chuck movably coupled to said base, said chuck movable in at least a horizontal linear direction with respect to said base; and
   a fixed buffer station having a plurality of support elements fixedly positioned above said base, said plurality of support elements including a first set of support elements and a second set of support elements;
   wherein the support elements in said first set of support elements are separated from each other so that they can support a substrate at the periphery of the substrate while the chuck moves in a horizontal linear direction between the support elements without contacting the support elements; and
   wherein the support elements in said second set of support elements are separated from each other so that they can support a substrate at the periphery of the substrate while the chuck moves in a horizontal linear direction to pass between the second set of support elements without contacting with second set of support elements;
   wherein said first set of support elements support a substrate in a position higher than the position that said second set of support elements support a substrate and said plurality of support elements have fixed vertical and horizontal positions relative to each other.

12. The stage of claim 11, wherein said chuck moves in a vertical linear direction and wherein said chuck loads and unloads substrates onto said plurality of support elements.

* * * * *